(12) United States Patent
Okura et al.

(10) Patent No.: US 9,306,589 B1
(45) Date of Patent: Apr. 5, 2016

(54) ANALOG-DIGITAL CONVERSION SYSTEM AND METHOD FOR CONTROLLING THE SAME

(71) Applicant: Spansion LLC, Sunnyvale, CA (US)

(72) Inventors: Tetsuro Okura, Kanagaw (JP); Yusaku Ito, Kanagaw (JP); Hirohiko Sadamatsu, Kanagaw (JP)

(73) Assignee: Cypress Semicondcutor Corporation, San Jose, CA (US)

( * ) Notice: Subject to any disclaimer, the term of this patent is extended or adjusted under 35 U.S.C. 154(b) by 0 days.

(21) Appl. No.: 14/503,585

(22) Filed: Oct. 1, 2014

(51) Int. Cl.
  H03M 1/12  (2006.01)
  H03M 1/06  (2006.01)
  H03M 1/44  (2006.01)
  H03F 1/08  (2006.01)

(52) U.S. Cl.
  CPC .............. *H03M 1/0609* (2013.01); *H03F 1/08* (2013.01); *H03M 1/0626* (2013.01); *H03M 1/124* (2013.01); *H03M 1/442* (2013.01); *H03F 2200/372* (2013.01); *H03F 2200/375* (2013.01)

(58) Field of Classification Search
  CPC .......... H03M 1/16; H03M 1/56; H03M 1/08; H03M 1/124; H03M 1/442; H03M 1/0626; H03M 1/06; H03M 3/39; H03M 3/382; H03D 7/02; H03D 7/165; H03D 7/1483; H03D 1/10
  USPC ............. 341/155, 166, 169, 172; 327/72, 355
  See application file for complete search history.

(56) References Cited

U.S. PATENT DOCUMENTS

| | | | | |
|---|---|---|---|---|
| 4,668,916 A * | 5/1987 | Pech | ...................... | G01N 27/61 324/216 |
| 4,685,139 A * | 8/1987 | Masuda | .............. | B41F 33/0036 250/559.44 |
| 4,892,114 A * | 1/1990 | Maroney | ............. | F16L 55/1022 137/87.03 |
| 5,307,426 A * | 4/1994 | Kanno | ................. | H04N 1/4053 358/3.05 |
| 5,321,404 A * | 6/1994 | Mallinson | ............... | H03M 1/16 341/141 |
| 5,818,378 A * | 10/1998 | Cheng | ................... | H03M 1/367 333/18 |
| 6,448,916 B1 * | 9/2002 | Leung | ................. | H03M 1/0663 341/144 |
| 6,448,917 B1 * | 9/2002 | Leung | ................. | H03M 1/0663 341/144 |
| 6,788,340 B1 * | 9/2004 | Chen | ...................... | H04N 5/243 348/229.1 |
| 6,937,664 B1 * | 8/2005 | Park | ........................ | H04L 25/49 375/259 |
| 7,479,910 B1 * | 1/2009 | Heinks | ................. | A61N 1/3704 341/118 |
| 9,160,488 B2 * | 10/2015 | Jeon | ...................... | H04L 1/0042 |
| 2013/0229294 A1 * | 9/2013 | Matsuno | ............. | H03M 1/0607 341/155 |

\* cited by examiner

*Primary Examiner* — Lam T Mai

(57) ABSTRACT

An analog-digital conversion system includes an analog-digital converter; and a preamplifier circuit which is provided in the previous stage of the analog-digital converter and differentially amplifies an input analog signal. In the preamplifier circuit, an offset voltage and/or a noise occurs and/or is mixed. The preamplifier circuit outputs two types of analog amplified differential signals where a phase is inverted only with respect to the offset voltage and/or the noise. The analog-digital converter has an averaging circuit which averages the two types of analog amplified differential signals for each clock cycle of sampling preceding an analog-digital conversion and outputs a digital signal based on the differential signal averaged by the averaging circuit.

16 Claims, 23 Drawing Sheets

FIG. 3B

| | Phase I | Phase II | Phase III | | | |
|---|---|---|---|---|---|---|
| SW1(21-24,31) | ON | OFF | OFF | ON | OFF | OFF |
| SW2(21-24,31) | OFF | ON | OFF | OFF | ON | OFF |
| SW32 | ON | ON | OFF | ON | ON | OFF |
| SWR | OFF | OFF | ON | OFF | OFF | ON |
| ADC3 | sampling | | conversion | sampling | | conversion |
| | t0　　t1 | t2 | | t3 | t4 | t5 |

FIG.4B

| | Phase I | Phase II | Phase III | | | |
|---|---|---|---|---|---|---|
| SW1(21-24,31) | ON | OFF | OFF | ON | OFF | OFF |
| SW2(21-24,31) | OFF | ON | OFF | OFF | ON | OFF |
| SW32 | ON | ON | OFF | ON | ON | OFF |
| SWR | OFF | OFF | ON | OFF | OFF | ON |
| ADC3 | sampling | | conversion | sampling | | conversion |
| | t0 | t1   t2 | | t3 | t4   t5 | |

FIG.5B

| | Phase I | Phase II | Phase III | | | |
|---|---|---|---|---|---|---|
| SW1(21-24,31) | ON | OFF | OFF | ON | OFF | OFF |
| SW2(21-24,31) | OFF | ON | OFF | OFF | ON | OFF |
| SW32 | ON | ON | OFF | ON | ON | OFF |
| SWR | OFF | OFF | ON | OFF | OFF | ON |
| ADC3 | sampling | | conversion | sampling | | conversion |
| | t0 | t1 | t2      t3 | t4 | t5 | |

ANALOG-DIGITAL CONVERSION SYSTEM AND METHOD FOR CONTROLLING THE SAME

BACKGROUND

1. Technical Field

This disclosure relates to an analog-digital conversion system and a method for controlling the same.

2. Related Art

Auto-zeroing techniques function to reduce noise and/or offset voltages in an analog-to-digital converter (ADC). According to such techniques, the input to an amplifier in an ADC circuit's be interrupted and connected to a constant potential. In this state, an offset voltage and a low frequency noise (e.g., flicker noise (1/f noise) and the like), can be sampled by a capacitor provided on the output side or the input side of the amplifier circuit separately from the ADC. This sample can then be used to reduce or eliminate noise and/or unwanted offset voltages.

Sometimes, however, it can be difficult to reduce the effect of a relatively high frequency noise having a shorter cycle than the sampling time on the capacitor provided between the amplifier circuit and the ADC or the sampling time on the capacitor in the ADC. Moreover, some auto-zeroing techniques require adding a capacitor for sampling the offset voltage and the noise and a period for sampling such undesirable signal components. Additionally, a low-pass filter may be required in some instances thereby, increasing the complexity of the circuit and the required. It is desirable to reduce or eliminate these problems.

BRIEF SUMMARY

Aspects of the disclosure relate to providing an analog-digital conversion system and an analog-digital conversion method capable of solving the problems of the conventional techniques. For instance, the disclosure describes solutions that prevent or reduce the effect of the high frequency noise while sufficiently reducing offset voltage and low frequency noise, without requiring an additional capacitor and sampling time for the offset voltage and the noise. Additionally, the disclosed solutions improve applicability to wide band systems.

Various embodiments of the disclosure relate to an analog-digital conversion system that includes an analog-digital converter and a preamplifier. The preamplifier can be provided in a previous stage of the analog-digital converter and configured to differentially amplify an input analog signal. An offset voltage and/or a noise can be mixed in the preamplifier and output as two types of analog amplified differential signals with a phase inverted with respect to the offset voltage and/or the noise. According to some embodiments, the phase of the input analog signal is not inverted in the preamplifier circuit. Furthermore, the analog-digital converter may include an averaging circuit configured to average the two types of analog amplified differential signals for each clock cycle of sampling preceding an analog-digital conversion and outputs a digital signal based on the differential signal averaged by the averaging circuit.

The averaging circuit may include capacitors corresponding to the two types of analog amplified differential signals and be configured to average the two types of analog amplified differential signals by using the capacitors to sample the signal at least once each clock cycle.

According to some embodiments, the preamplifier circuit may include: an input switching section that switches a first voltage signal and a second voltage signal as the analog input signals between a non-inverting input terminal and an inverting input terminal; and an output switching section which switches outputs of the two types of analog amplified differential signals. The averaging circuit may include a distribution section that selectively distributes the two types of analog amplified differential signals to the corresponding capacitors. According to some embodiments, the averaging circuit can average the differential signals by linear combination of electrical charges which correspond to the two types of analog amplified differential signals sampled to each of the capacitors.

Some embodiments may include a plurality of capacitors corresponding to the two types of analog amplified differential signals. According to some embodiments there may be an even number of capacitors. The capacitors may sample each of the two types of analog amplified differential signals a plurality of times.

Various embodiments of the disclosure include a method for controlling an analog-digital conversion system. The method includes an analog-digital conversion process and a preamplification process. According to various embodiments, the preamplification process may be performed prior to the analog-digital conversion process. According to embodiments, the analog-digital conversion process may include differentially amplifying an input analog signal. In the preamplification process, an offset voltage and/or a noise can be mixed and two types of analog amplified differential signals are output where a phase is inverted only with respect to the offset voltage and/or the noise. In the analog-digital conversion process, the two types of analog amplified differential signals are averaged for each clock cycle of sampling preceding an analog-digital conversion and a digital signal is output based on the averaged differential signal.

Further features and advantages of embodiments, as well as the structure and operation of various embodiments, are described in detail below with reference to the accompanying drawings. It is noted that the scope of the disclosure is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the disclosure will now be described, by way of example only, with reference to the accompanying schematic drawings in which corresponding reference symbols indicate corresponding parts. Further, the accompanying drawings, which are incorporated herein and form part of the specification, illustrate embodiments of the present disclosure, and, together with the description, further serve to explain the principles of the disclosure and to enable a person skilled in the relevant art(s) to make and use the disclosure.

FIG. 3B is a timing diagram depicting the operation of a circuit according to various embodiments.

FIG. 4B is a timing diagram depicting the operation of a circuit according to various embodiments.

FIG. 5B is a timing diagram depicting the operation of a circuit according to various embodiments.

Figure 1:
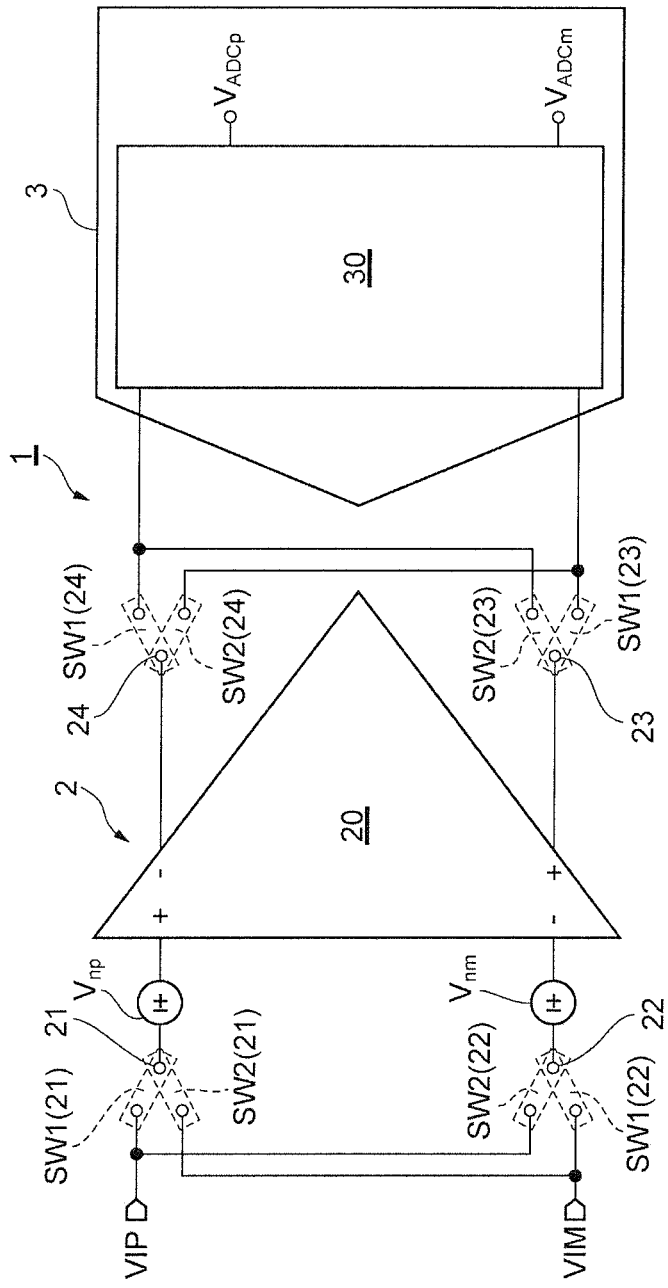
FIG. 1 is a block diagram illustrating the circuit configuration of an analog-digital conversion system according to various embodiments.

The features and advantages of embodiments of the present disclosure will become more apparent from the detailed description set forth below when taken in conjunction with the drawings. In the drawings, like reference numbers generally indicate identical, functionally similar, and/or structurally similar elements

DETAILED DESCRIPTION

In the following detailed description, reference is made to the accompanying drawings, which form a part hereof. In the drawings, similar symbols typically identify similar components, unless context dictates otherwise. Further, the drawings are intended to be explanatory and may not be drawn to scale. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

In other words, the following embodiments are illustrated for describing the present disclosure, and the present disclosure is not limited to the embodiments. Furthermore, embodiments described in the present disclosure can be modified in various ways insofar as they do not deviate from the scope of the disclosure. Moreover, a positional relation such as up, down, left and right may be based on the positional relation as is illustrated in the drawings, unless otherwise specifically indicated. A dimensional ratio in the drawings is not limited to the shown ratio.

As stated above, the analog-digital conversion system according to the present disclosure includes an analog-digital converter and a preamplifier circuit which is provided in the previous stage of the analog-digital converter and differentially amplifies an input analog signal. Moreover, an offset voltage and/or a noise occurs and/or is mixed in the preamplifier circuit, and the preamplifier circuit outputs two types of analog amplified differential signals where a phase is inverted only with respect to the offset voltage and/or the noise. Furthermore, the analog-digital converter has an averaging circuit which averages the two types of analog amplified differential signals for each clock cycle of sampling preceding an analog-digital conversion and outputs a digital signal based on the differential signal averaged by the averaging circuit.

In this configuration, the two types of analog amplified differential signals for the input analog signal including an offset voltage and a noise (low frequency noise or the like), which inevitably occur, are obtained as output signals where the phase of the input analog signal component is not inverted while the phase of only the offset voltage and/or noise is inverted. Therefore, the two types of analog amplified differential signals are averaged through the averaging circuit, by which only the offset voltage is canceled and disappears and the noise can be sufficiently reduced by the same cancellation effect. As a result, the offset voltage can be removed and the influence of the low frequency noise can be sufficiently suppressed.

Moreover, a period of one clock cycle is divided into a plurality of sampling periods due to such averaging and thus each sampling period is shorter than the period of one clock cycle. Therefore, for example, in the case of performing sampling by using capacitors provided so as to respectively correspond to two types of analog amplified differential signals, the load capacitance in each sampling also decreases along with decrease in the sampling period. Therefore, as a result, current consumption of each clock cycle does not change. Furthermore, shortening the sampling period, in other words, faster sampling is achieved in this manner and therefore higher frequency components (higher frequency noise) can be reduced as well as low frequency noise. Still further, a low-pass filter having a relatively low cutoff frequency is not used and therefore the analog-digital conversion system according to the present disclosure is satisfactorily adaptable to a wide-band system. Moreover, there is no need to provide an additional capacitor and an additional sampling period in addition to the normal sampling.

The present disclosure will be further described hereinafter with illustration of specific embodiments.

FIG. 1 is a block diagram illustrating the circuit configuration of an analog-digital conversion system according to various embodiments. The analog-digital conversion system 1 includes a preamplifier circuit 2, which differentially amplifies an input analog signal, and an analog-to-digital converter (ADC) 3 connected to the preamplifier circuit 2.

The preamplifier circuit 2 includes an amplifier circuit 20 having a non-inverting input terminal 21, an inverting input terminal 22, a non-inverting output terminal 23, and an inverting output terminal 24. The non-inverting input terminal 21 is provided with input switches SW1(21) and SW2(21) and the inverting input terminal 22 is provided with input switches SW1(22) and SW2(22). A first input voltage VIP and a second input voltage VIM are input switchably between the non-inverting input terminal 21 and the inverting input terminal 22 via the input switches SW1(21, 22) and SW2(21, 22). In this manner, these input switches constitute an "input switching section."

Moreover, the non-inverting output terminal 23 is provided with output switches SW1(23) and SW2(23) and the inverting output terminal 24 is provided with output switches SW1(24) and SW2(24). Two types of output signals of the preamplifier circuit (analog amplified differential signals), which have been differentially amplified with a predetermined gain, are input to an averaging circuit 30 of the ADC 3 via the output switches SW1(23, 24) and SW2(23, 24). In this manner, these output switches constitute an "output switching section." Furthermore, in the averaging circuit 30 of the ADC 3, each analog amplified differential signal, which has been input, is sampled by the capacitor at predetermined clock cycles and voltage signals $V_{ADCp}$ and $V_{ADCm}$ for conversion to digital signals are output on the basis of the sampled signals. Reference characters Vnp and Vnm illustrated on the input side of the preamplifier circuit 2 in FIG. 1 indicate offset voltages mixed into the preamplifier circuit 2 as voltage signals for convenience.

Figure 2A:
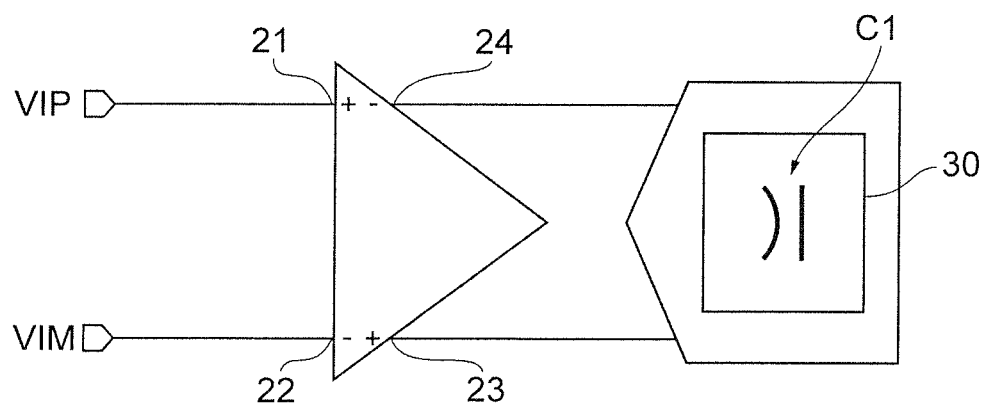
FIGS. 2A and 2B illustrate a preamplifier circuits with their outputs sampled by capacitors according to various embodiments.
Figure 2B:
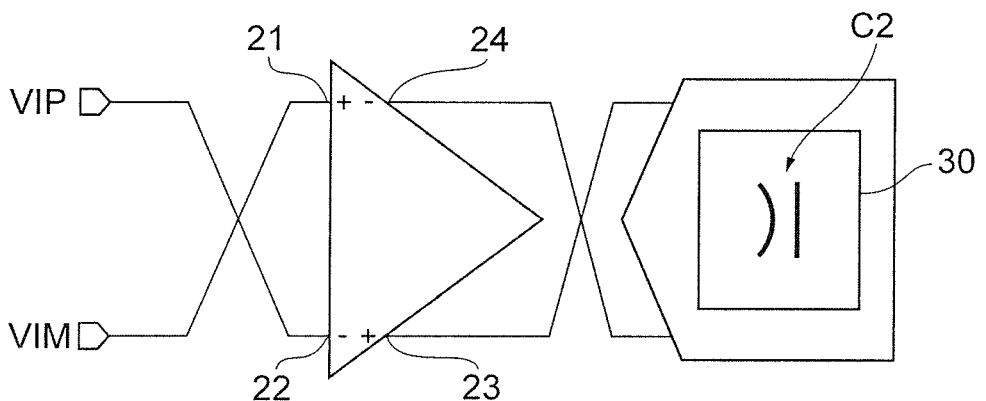

The following outlines a relationship between the switching operation of each of the input switches SW1(21, 22) and SW2(21, 22) and the output switches SW1(23, 24) and SW2(23, 24) connected to the amplifier circuit 20 in the preamplifier circuit 2 and the sampling capacitor in the averaging circuit 30 in order to make it easier to understand a concrete example of the operation of the analog-digital conversion system 1 described later. FIGS. 2A and 2B are conceptual charts schematically illustrating a state where two types of analog amplified differential signals are sampled by capacitors.

In the analog-digital conversion system 1 according to this embodiment, the switch SW1(21 to 24, 31) group and the switch SW2(21 to 24, 31) group of the preamplifier circuit 2 are controlled to be selectively switched and to be mutually linked. The switches SW1(31) and SW2(31) (see, e.g., FIGS. 3A, 4A, and 5A), which are provided in the averaging circuit 30 of the ADC 3, will be described later. FIG. 2A depicts a state where the switch SW1 is ON at terminals 21 to 24 and 31. In this state, the analog amplified differential signals are sampled by a capacitor C1 provided in the averaging circuit 30 of the ADC 3. In contrast, FIG. 2B depicts a state where the switch SW2 is ON at terminals 21 to 24 and 31. In this state, analog amplified differential signals are sampled by a capacitor C2 provided in the averaging circuit 30 of the ADC 3 (FIG. 2B). In this embodiment, the capacitor C1 is made equal to the capacitor C2. Specifically, the capacitors C1 and C2 are obtained by equivalently dividing the original sampling capacitor in the ADC 3 into two.

More specifically, if the first input voltage VIP is input to the non-inverting input terminal 21 via the input switch SW1(21) and the second input voltage VIM is input to the inverting input terminal 22 via the input switch SW1(22), the non-inverting output terminal 23 and the inverting output terminal 24 are switched to the output switches SW1(23) and SW1(24), respectively. An analog amplified differential signal at this time (hereinafter, referred to as "first amplified output V1") is sampled by the capacitor C1 in the averaging circuit 30 of the ADC 3 (FIG. 2A).

On the other hand, if the first input voltage VIP is input to the inverting input terminal 22 via the input switch SW2(22) and the second input voltage VIM is input to the non-inverting input terminal 21 via the input switch SW2(21), the non-inverting output terminal 23 and the inverting output terminal 24 are switched to the output switches SW2(23) and SW2(24), respectively. An analog amplified differential signal at this time (hereinafter, referred to as "second amplified output V2") has a phase inverted relative to the first amplified output V1 only with respect to the offset voltage and the noise and is sampled by the capacitor C2 in the averaging circuit 30 of the ADC 3 (FIG. 2B). Specifically, the components corresponding to the first input voltage VIP and the second input voltage VIM in the first amplified output V1 have the same phase as the components corresponding to the first input potential VIP and the second input potential VIM in the second amplified output V2. On the other hand, the components corresponding to the offset voltage and the noise in the first amplified output V1 have a phase inverted to that of the components corresponding to the offset voltage and the noise in the second amplified output V2.

Figure 3A:
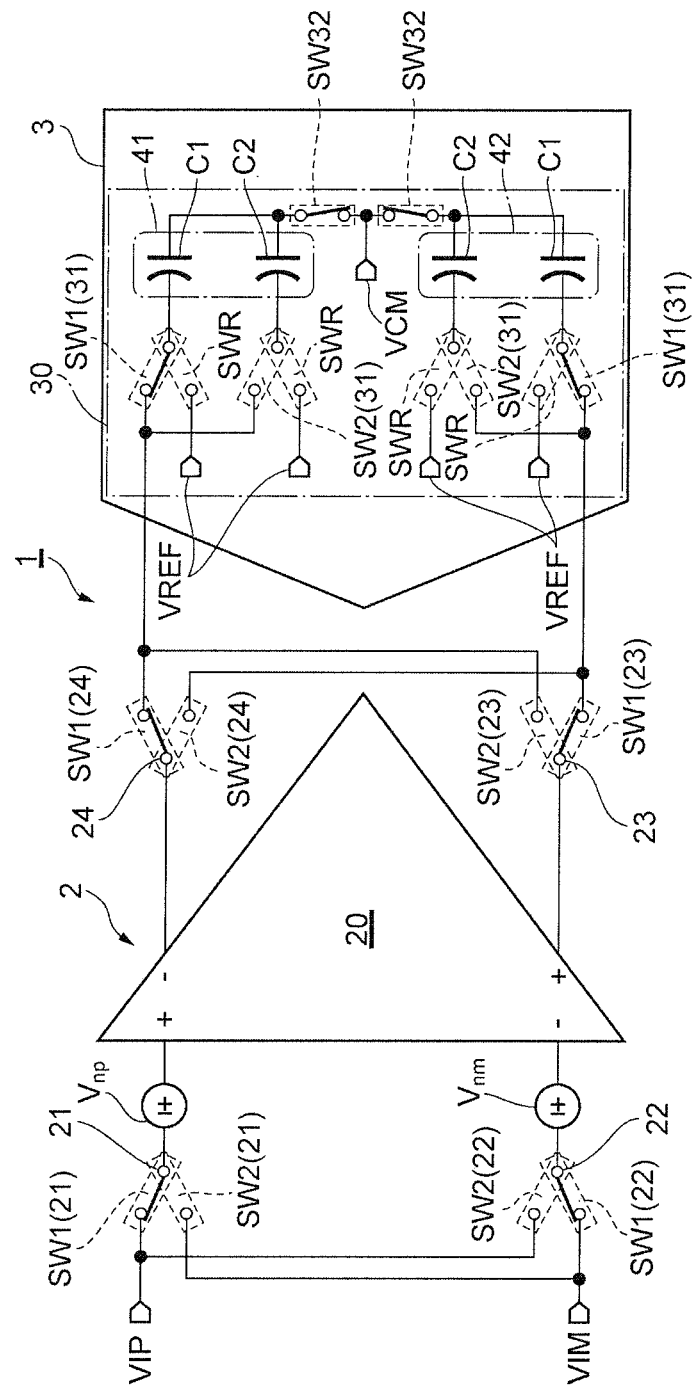
FIG. 3A is a block diagram illustrating a system with an output sampled by a capacitor according to various embodiments.
Figure 4A:
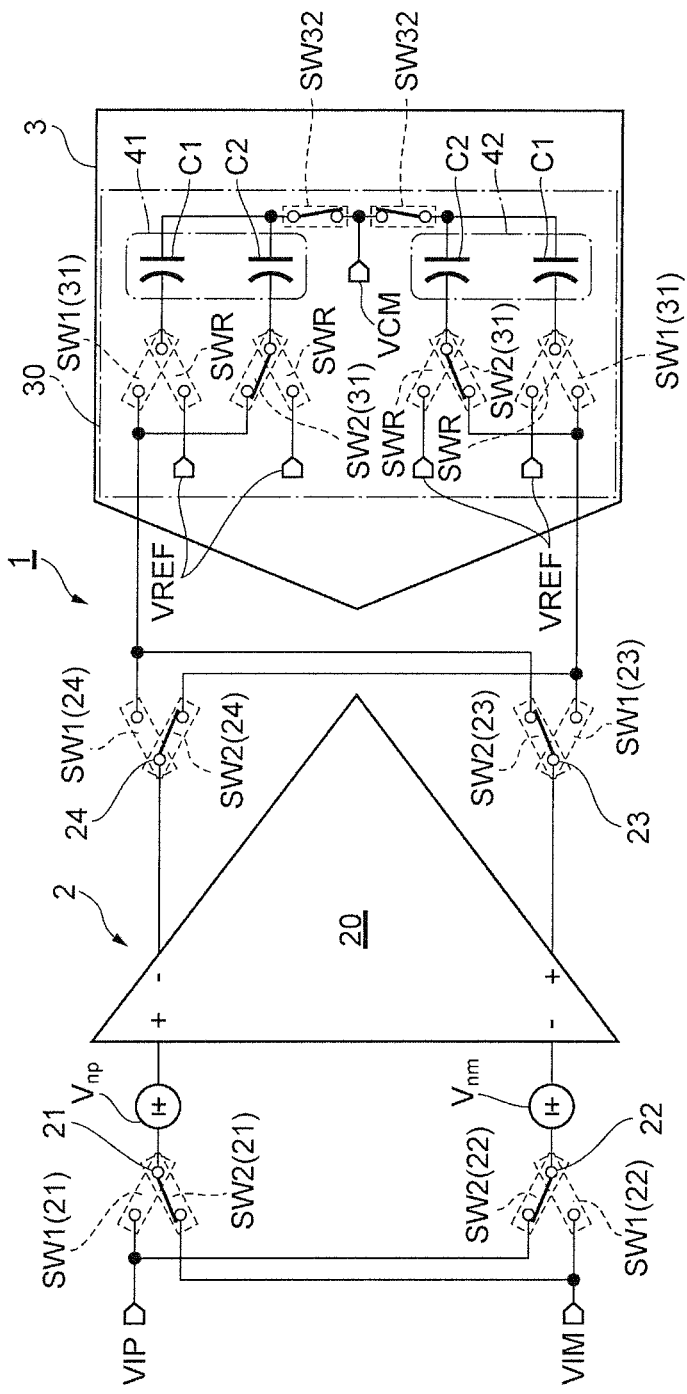
FIG. 4A is a block diagram illustrating a circuit with an output sampled by a capacitor according to various embodiments.
Figure 5A:
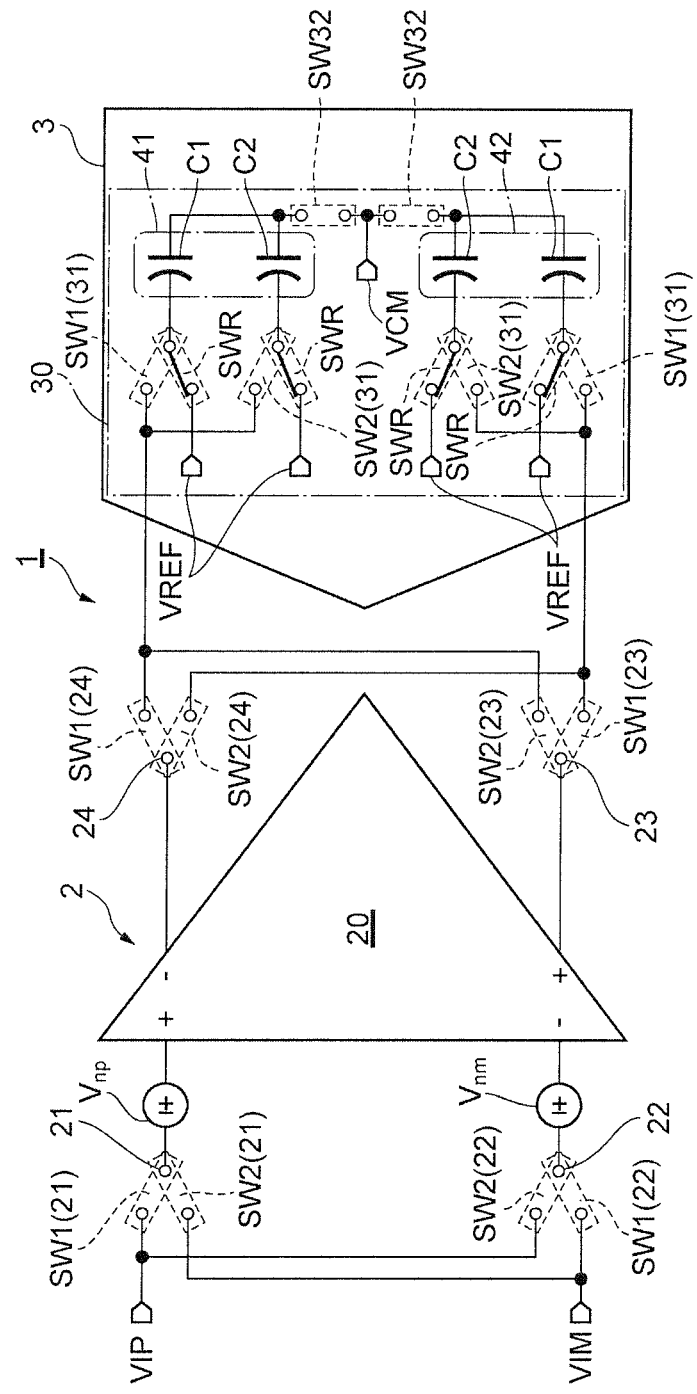
FIG. 5A is a block diagram illustrating a circuit with an output sampled by a capacitor according to various embodiments.

The following describes the operation of the sampling capacitor of the averaging circuit 30 in more detail with reference to FIGS. 3A, 3B, 4A, 4B, 5A, and 5B. FIG. 3A is a system block diagram illustrating an example of a state where an analog amplified differential signal is sampled by capacitor in the ADC 3 (Phase I). Moreover, FIG. 3B illustrates an example of a timing diagram in a state where the analog-digital conversion system 1 is in operation with a Phase-I portion highlighted. Moreover, FIG. 4A is a system block diagram illustrating an example of a state where an analog amplified differential signal is sampled by capacitor in the ADC 3 (Phase II) and FIG. 4B is a diagram where a Phase-II portion is highlighted in the timing diagram illustrated in FIG. 3B. Furthermore, FIG. 5A is a system block diagram illustrating an example of a conversion phase of the ADC 3 (Phase III) and FIG. 5B is a diagram where a Phase-III portion is highlighted in the timing diagram illustrated in FIG. 3B.

As illustrated in FIGS. 3A, 4A, and 5A, the averaging circuit 30 of the ADC 3 has two systems of capacitor sections 41 and 42. The capacitors C1 and C2 illustrated in FIGS. 2A and 2B and described above are provided in each of the capacitor sections 41 and 42. On the input side of the capacitor C1, there are provided switches SW1(31) and SWR so as to be switchable to each other. These switches SW1(31) and SWR are each connected to an output of the preamplifier circuit 2 and a reference voltage VREF. The reference voltage VREF may be either different from each other (different potentials) or the same as each other (the same potential), and further may be either used in common or not (The same applies hereinafter). Moreover, the input side of the capacitor C2 is connected to the switches SW2(31) and SWR which are provided so as to be switchable to each other. These switches SW2(31) and SWR among them are each connected to an output of the preamplifier circuit 2 and a reference voltage VREF. In this manner, the switches provided on the input side of the capacitors C1 and C2 in the averaging circuit 30 constitute a "distribution section" which distributes the first amplified output V1 and the second amplified output V2 to the capacitors C1 and C2. In addition, the capacitor sections 41 and 42 are connected to a predetermined constant voltage VCM via switches SW32 and SW32 provided on the output side of the capacitor sections 41 and 42.

In the analog-digital conversion system 1, input signal sampling and digital conversion is performed by the ADC 3 continuously for each clock cycle. More specifically, as illustrated in FIGS. 3B, 4B, and 5B, the input signal is sampled by the capacitor of the ADC 3 for a time period from time t0 to time t2 and the input signal is converted to digital signal by the ADC 3 for a subsequent time period from time t2 to time t3. In other words, the time period from time t0 to time t3 corresponds to one clock cycle of the sampling and digital conversion performed by the ADC 3. Moreover, the sampling period (from time t0 to time t2) by the capacitor of the ADC 3 is divided into two: Phase I from time t0 to time t1; and Phase II from time t1 to time t2. In this embodiment, the time for Phase I is equal to the time for Phase II. Moreover, in this embodiment, after time t3, processing equivalent to the processing from time t0 to time t3 is repeated.

As illustrated in FIGS. 3A and 3B, switch changeover is performed so that the switch SW1(21 to 24, 31) group of the preamplifier circuit 2 is on in Phase I (from time t0 to time t1). Thus, electric charges caused by the first amplified output V1 (voltage signal) obtained by differentially amplifying the first input voltage VIP and the second input voltage VIM in the amplifier circuit 20 are charged to the capacitors C1 of the capacitor sections 41 and 42. Moreover, the switch SW2(21 to 24, 31) group and the switch SWR are off at this time, while the switches SW32 and SW32 between the capacitor sections 41 and 42 are on.

The first amplified output V1, which correspond to an analog amplified differential signal, is a differential voltage between the voltage signals output from the non-inverting output terminal 23 and the inverting output terminal 24. Moreover, the offset voltages Vnp and Vnm are mixed into and superimposed on the first input voltage VIP and the second input voltage VIM input to the preamplifier circuit 2 as described above and therefore the first amplified output V1 is able to be represented by the following formula (1), where character "A" in the formula indicates an inversion gain of the amplifier circuit 20:

$$V1 = -A^* \{(VIP+Vnp)-(VIM+Vnm)\} \quad (1)$$

Moreover, an electric charge Q1 charged to the capacitor C1 by the first amplified output V1 is able to be represented by the following formula (2) according to the relationship Q=CV:

$$Q1 = C1^* A^* \{(VIP+Vnp)-(VIM+Vnm)\} \quad (2)$$

Subsequently, as illustrated in FIGS. 4A and 4B, the switch SW2(21 to 24, 31) group of the preamplifier circuit 2 turns on at Phase II (from time t1 to time t2). Thus, electric charges caused by the second amplified output V2 (voltage signal) obtained by differentially amplifying the first input voltage VIP and the second input voltage VIM by the amplifier circuit 20 are charged to the capacitors C2 of the capacitor sections 41 and 42. Moreover, the switch SW1(21 to 24, 31) group and the switch SWR are off, while the switches SW32 and SW32 between the capacitor sections 41 and 42 are on.

The second amplified output V2 is also a differential voltage between the voltage signals output from the non-inverting output terminal 23 and the inverting output terminal 24 similarly to the first amplified output V1. This second amplified output V2 has a phase inverted relative to the first amplified output V1 only with respect to the offset voltage and the noise as described above and is able to be represented by the following formula (3):

$$V2 = -A^* \{(VIP+Vnm)-(VIM+Vnp)\} \quad (3)$$

Moreover, an electric charge Q2 charged to the capacitor C2 by the second amplified output V2 is able to be represented by the following formula (4):

$$Q2 = C2^* A^* \{(VIP+Vnm)-(VIM+Vnp)\} \quad (4)$$

As described hereinabove, after the completion of the sampling by the capacitor of Phase I and Phase II, processing proceeds to analog-digital conversion in Phase III (from time t2 to time t3) as illustrated in FIGS. 5A and 5B. At this time, the switches SW2(31) turn off and the switches SWR turn on. At the same time, the switches SW32 and SW32 connecting the capacitor sections 41 and 42 to each other are turned off. These operations cause the electric charges charged to the capacitor sections 41 and 42 are output as voltage signals $V_{ADCp}$ and $V_{ADCm}$ for conversion to digital signals from the averaging circuit 30. Any of the switches SW1(21 to 24) and SW2(21 to 24) in the preamplifier circuit 2 may be either on or off. The diagrams illustrate a state where all of the switches SW1(21 to 24) and SW2(21 to 24) are off.

A differential signal $V_{DEF}$ between the voltage signals $V_{ADCp}$ and $V_{ADCm}$ obtained in this manner is able to be represented by the following formula (5) according to the capacitors C1 and C2 and the electric charges Q1 and Q2 stored therein:

$$V_{DEF} = V_{ADCp} - V_{ADCm} = (Q1+Q2)/(C1+C2) \quad (5)$$

If a relationship represented by the above formulas (2) and (4) is substituted into the formula (5) and the capacitor C1=the capacitor C2 is applied for simplification as described above, the differential signal $V_{DEF}$ is represented by the following formula (6):

$$V_{DEF} = A^*(VIP-VIM) \quad (6)$$

Thus, in the analog-digital conversion system 1, the sampling capacitor of the ADC 3 is equivalently divided into two (the capacitor C1=the capacitor C2) and the first amplified output V1 and the second amplified output V2, where the phase is inverted only with respect to the offset voltage and the noise, are sequentially sampled by separate capacitor at separate phase. Then, the offset voltages Vnp and Vnm, which inevitably occur in the preamplifier circuit 2, are able to cancel at $V_{DEF}$ which is an average signal of two sampling results. Furthermore, the ADC 3 outputs signals having been digitally converted on the basis of the differential signal $V_{DEF}$ and then completes the processing of one clock cycle for the sampling and digital conversion at this time point.

Furthermore, it is assumed that the terms Vnp and Vnm of the offset voltages described above represent signals (electromagnetic noise or the like represented by a function for the time) which change temporally and periodically. For example, the magnitudes (amplitudes) of the noises at time t are assumed to be Vnp(t) and Vnm(t) and the magnitudes (amplitudes) of the noises at time t+tp after an elapse of time tp are assumed to be Vnp(t+tp) and Vmn(t+tp). If it is supposed that time t is time in Phase I illustrated in FIGS. 3A and 3B and that time t+tp is time in Phase II, the above formulae (1) to (4) can be rewritten into the following formulae (1)' to (4)':

$$V1 = -A^* [\{VIP+Vnp(t)\}-\{VIM+Vnm(t)\}] \quad (1)'$$

$$Q1 = C1^* A^* [\{VIP+Vnp(t)\}-\{VIM+Vnm(t)\}] \quad (2)'$$

$$V2 = -A^* [\{VIP+Vnm(t+tp)\}-\{VIM+Vnp(t+tp)\}] \quad (3)'$$

$$Q2 = C2^* A^* [\{VIP+Vnm(t+tp)\}-\{VIM+Vnp(t+tp)\}] \quad (4)'$$

If a relationship represented by the above formulas (2)' and (4)' is substituted into the formula (5) and the capacitor C1=the capacitor C2 is applied for simplification in the same manner described above, the differential signal $V_{DEF}$ can be rewritten into the following formula (6)':

$$V_{DEF}=A^*\{(VIP-VIM)+[Vnp(t)-Vnp(t+tp)]/2-[Vnm(t)-Vnm(t+tp)]/2\} \quad (6)'$$

Given the comparison between the formulae (6) and (6)', the value of the differential signal $V_{DEF}$ represented by the formula (6)' approaches the value of the differential signal $V_{DEF}$ of the formula (6), since the smaller the fluctuations of the noises Vnp and Vnm in the period (for example, ta) of the sampling in Phase I by the capacitor C1 and the sampling in Phase II by the capacitor C2, the smaller the components of the second and third terms. In other words, the lower (smaller) than 1/ta the frequencies of the noises Vnp and Vnm are, in other words, the lower in frequency the noises Vnp and Vnm are, the higher the reduction effect is.

According embodiments of the analog-digital conversion system 1 having the above configuration, two types of analog amplified differential signals (the first amplified output V1 and the second amplified output V2) including an offset voltage and a low frequency noise (Vnp, Vnm), which inevitably occur, are sampled by the capacitors C1 and C2 different from each other for each clock cycle in an analog-digital conversion. Furthermore, as illustrated in the above formulae (1) to (6) and formulae (1)' to (6)', the averaging circuit 30 averages the two types of sampling signals to obtain the differential signal $V_{DEF}$, thereby enabling the offset voltages to be canceled for removal to reduce the low frequency noise sufficiently. In other words, the analog-digital conversion system 1 enables not only a reduction in the offset voltage, but also a remarkable reduction in the influence of flicker noise or thermal noise to which low frequency components greatly contribute.

Taking into consideration only the relationship represented by the above formula (6)', it is difficult to obtain a significant reduction effect on the noise Vnp or Vnm whose frequency is higher than 1/ta (i.e., a high-band component out of the noises Vnp and Vnm: high frequency component). The high frequency noise, however, never increases, and therefore there is no disadvantage that the bad influence of high frequency noise increases like a conventional AZ technique. On the contrary, compared with the conventional AZ technique, a single sampling period (for example, ta/2) can be reduced, in other words, faster sampling is achievable. Therefore, this approach also enables a reduction in high frequency components (high frequency noises), compared with the auto-zeroing technique.

Additionally, one clock cycle is equally divided and assigned to the sampling time of the capacitor C1 and the sampling time of the capacitor C2, and therefore the load capacitance in each sampling decreases. This enables the prevention of an increase in electric current for each clock cycle. Moreover, there is no need to use a low-pass filter having relatively low cutoff frequency like the conventional chopper stabilization, and therefore the analog-digital conversion system 1 is satisfactorily adaptable to analog-digital conversion of a wide-band system. Further, there is no need to separately provide a period for sampling an offset voltage or the like in addition to the sampling periods for the normal analog-digital conversion. Therefore, applicability to a low power consumption method such as an intermittent operation can be enhanced.

Figure 6:
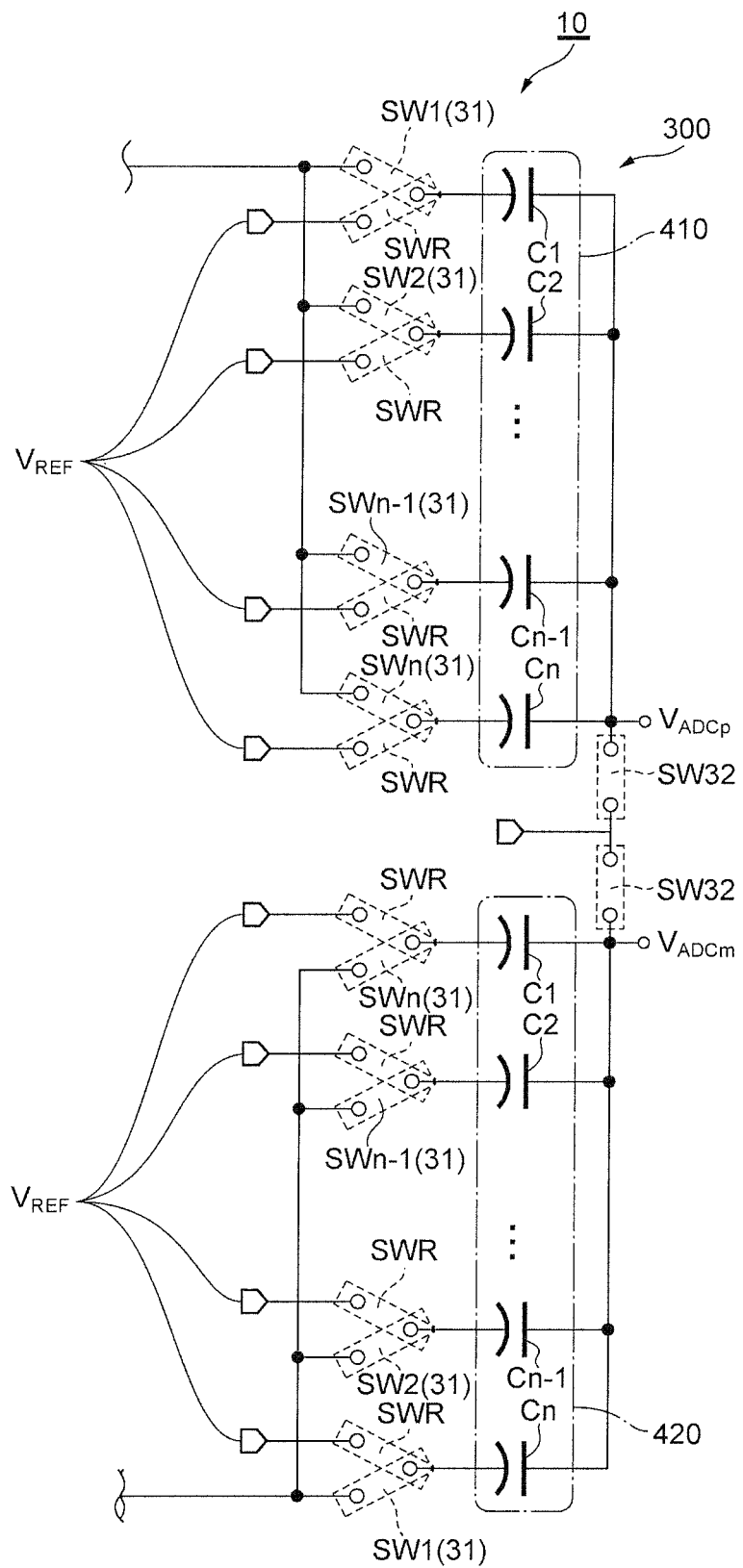
FIG. 6 is a block diagram illustrating the circuit configuration of an analog-digital conversion system according to various embodiments.

FIG. 6 is a system block diagram roughly illustrating the circuit configuration of an embodiment of the analog-digital conversion system. The analog-digital conversion system 10 is configured in the same manner as the aforementioned analog-digital conversion system 1 of the first embodiment, except that an averaging circuit 300 is provided instead of the averaging circuit 30 of the ADC 3. Moreover, the averaging circuit 300 includes two systems of capacitor sections 410 and 420, instead of the two systems of capacitor sections 41 and 42. These capacitor sections 410 and 420 each have n capacitors C1, C2, ..., and Cn (capacitor C1=capacitor C2= ... =capacitor Cn−1=capacitor Cn) obtained by equivalently dividing the sampling capacitor of the ADC 3 into n (n is limited to an even number). On the input side of each capacitor Cn, there are provided switches SWn(31) and SWR which are provided so as to be switchable to each other. A connection procedure between these switches and the outputs of the preamplifier circuit 2/the reference potential VREF is basically the same as in the analog-digital conversion system 1 of the first embodiment.

In the analog-digital conversion system 10 configured as described above, the sampling period to of one clock cycle in the ADC 3 is equally divided into n (ta/n). For each sampling period (ta/n), the analog amplified differential signal is repeatedly sampled by the switch SW1(21 to 24, 31) group in the ON state or by the switch SW2(21 to 24, 31) group in the ON state. Specifically, while "2" is the number of averaging in the analog-digital conversion system 1 of the first embodiment, "n" is the number of averaging in the analog-digital conversion system 10 of the second embodiment.

This enables one sampling period ta/n to be further shortened, thereby further increasing the reduction effect of the offset voltage and the low frequency noise. Since one sampling period can be further shortened in comparison with the auto-zeroing technique in this manner (in other words, faster sampling is achievable), high frequency noise can be further reduced, too. Furthermore, the analog-digital conversion system 10 is able to prevent deterioration of the operating characteristics during analog-digital conversion and is satisfactorily adaptable to a wide-band system in the same manner as the analog-digital conversion system 1.

In other words, there is provided a plurality of capacitors respectively corresponding to two types of analog amplified differential signals. Specifically, capacitors C1, ..., Ci, ..., and Cn−1 (i is an odd number) are provided for the first amplified output V1 and capacitors C2, ..., Cj, ..., and Cn (j is an even number) are provided for the second amplified output V2. With this configuration, it is also preferable that sampling is performed for each of the two types of analog amplified differential signals a plurality of times. This enables a further reduction in the sampling period for each capacitor. Consequently, the analog-digital conversion system 10 is able to further decrease the fluctuation of the low frequency component out of the offset voltage and the noise such as a flicker noise and to further enhance the reduction effect of the low frequency noise in the sampling period.

Furthermore, the noise characteristic has been verified by simulation with respect to an example of the analog-digital conversion system and two types of conventional systems in order to compare the analog-digital conversion system with the conventional techniques. As the conventional systems, the inventor selected a system using the aforementioned auto-zeroing (AZ) technique (Comparative Example 1: AZ method) and a system without the AZ technique (Comparative Example 2: w/o AZ method).

Figure 7A:
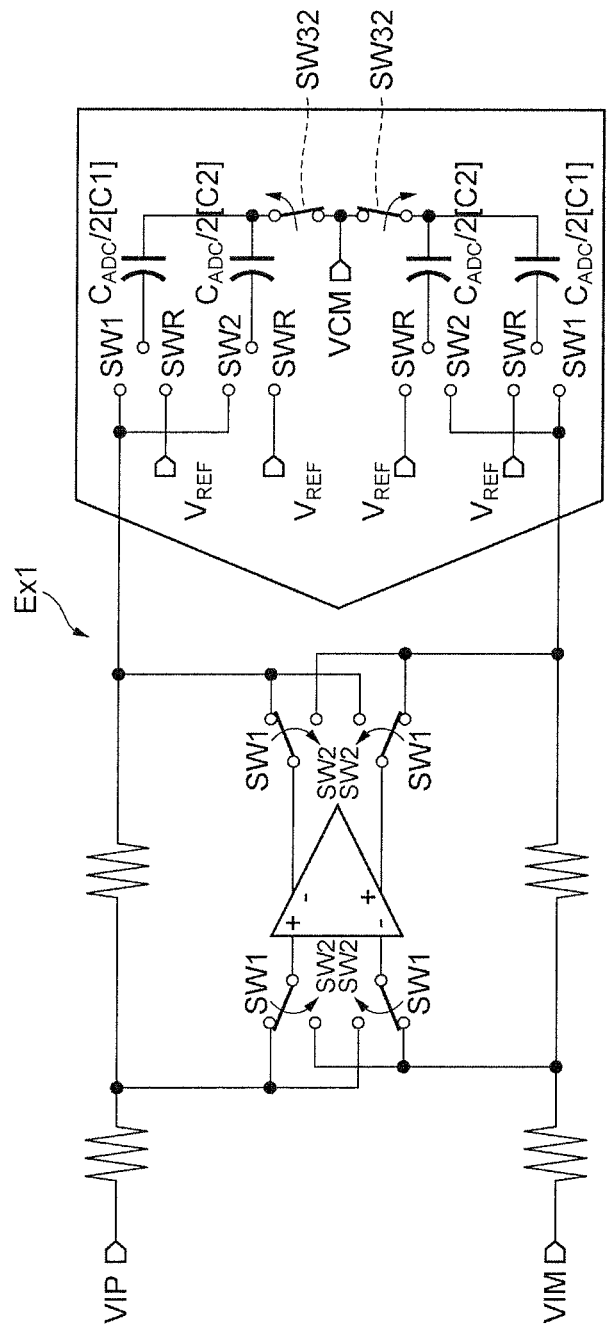
FIG. 7A is a block diagram illustrating a system with an output sampled by a capacitor according to various embodiments.
Figure 7B:
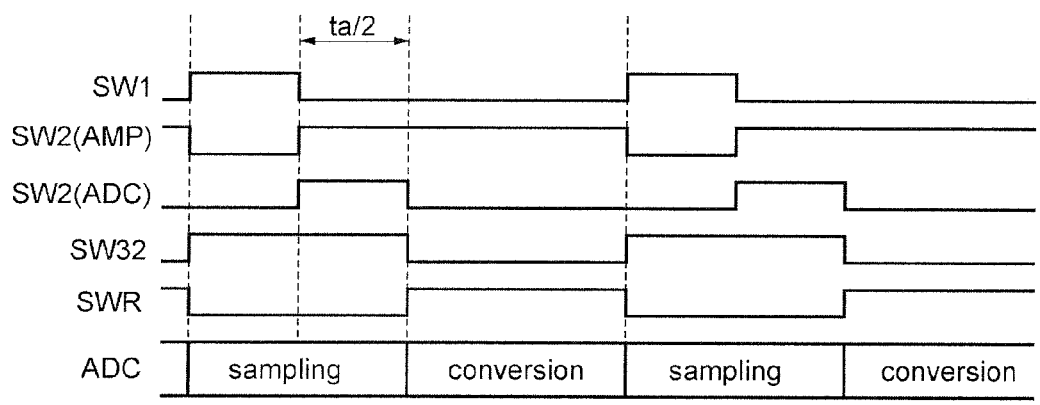
FIG. 7B is a timing diagram depicting the operation of a circuit according to various embodiments.
Figure 8A:
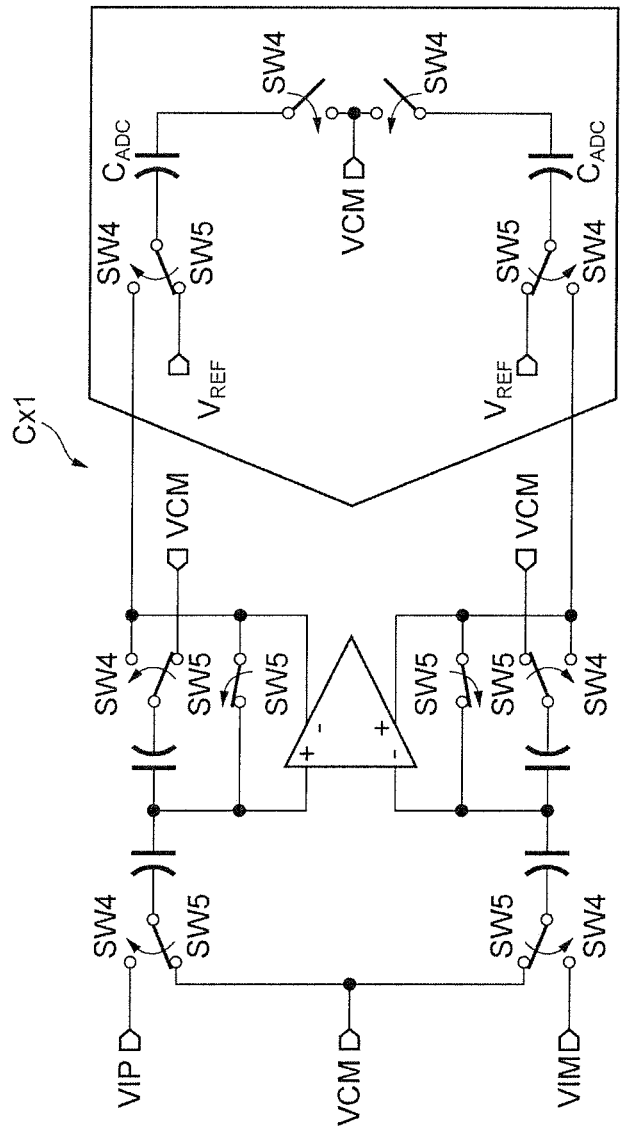
FIG. 8A is a block diagram illustrating a system according to various embodiments.
Figure 8B:
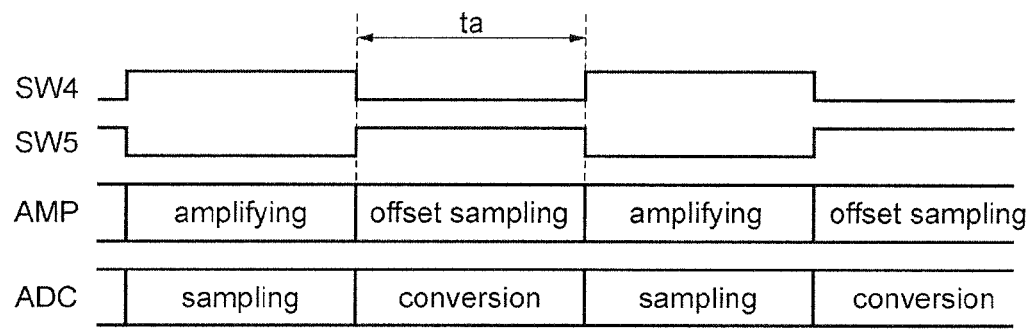
FIG. 8B is a timing diagram depicting the operation of a circuit according to various embodiments.
Figure 9A:
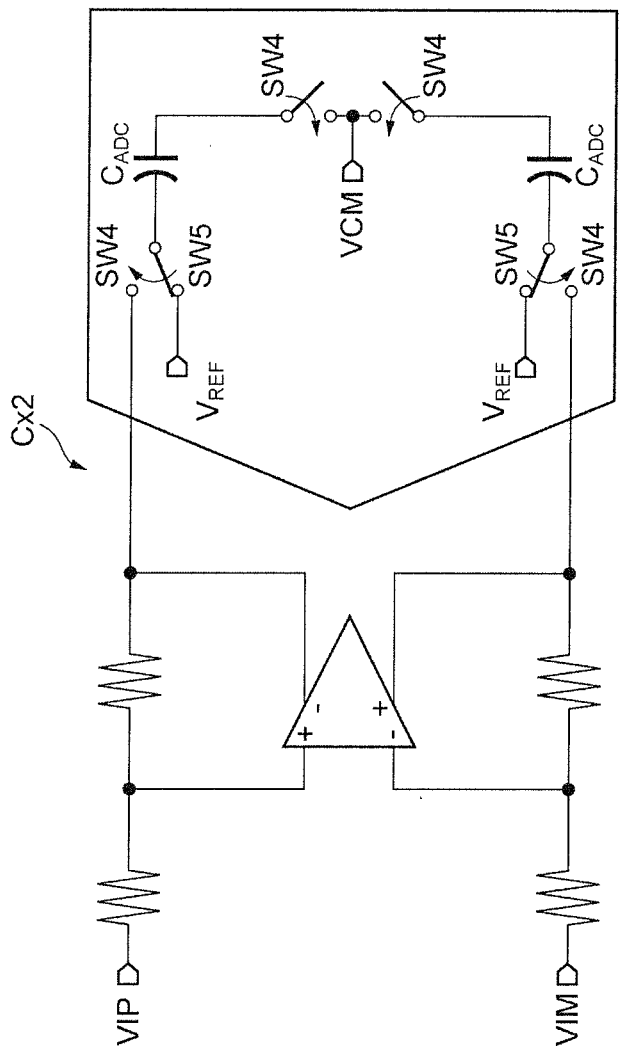
FIG. 9A is a block diagram illustrating a system according to various embodiments.
Figure 9B:
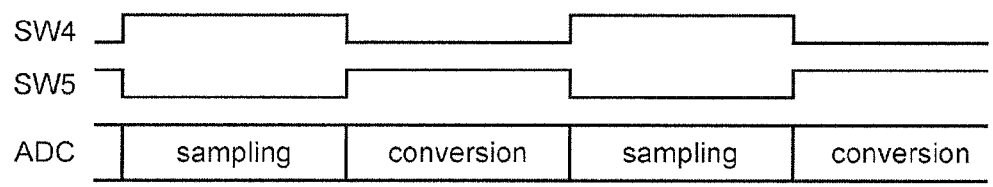
FIG. 9B is a timing diagram depicting the operation of a circuit according to various embodiments.

FIGS. 7A and 7B are a system block diagram illustrating a circuit configuration for simulation of an analog-digital conversion system Ex1 of Example 1 and a timing diagram in the operation, respectively. FIGS. 8A and 8B are a system block diagram illustrating a circuit configuration for simulation of an analog-digital conversion system Cx1 of Comparative Example 1 and a timing diagram in the operation, respectively. Furthermore, FIGS. 9A and 9B are a system block diagram illustrating a circuit configuration for simulation of an analog-digital conversion system Cx2 of Comparative Example 2 and a timing diagram in the operation, respectively.

As illustrated in FIGS. 7A and 7B, the analog-digital conversion system Ext of Example 1 has a configuration substantially equivalent to the analog-digital conversion system 1 of the first embodiment described above and is intended to perform the similar analog-digital conversion operation. Specifically, the analog-digital conversion system Ex1 divides a sampling period (ta) in the analog-digital conversion in half and performs individual sampling to the capacitor $C_{ADC}/2$ (corresponding to the capacitor C1, C2) and differential output with averaging using the capacitors for each sampling period (ta/2) by the changeover of switches. FIG. 7B illustrates a state where the switch SW2 is kept on during the analog-digital conversion. In addition, the analog-digital conversion system Ext is equipped with resisters provided as shown in FIG. 7A. Thereby, provided that the precision of a gain A obtained by the preamplifier circuit 2 might deteriorate due to the influence of resistance when the switch is turned on, it can be effectively prevented from occurring such deterioration.

Moreover, as illustrated in FIG. 8A, the analog-digital conversion system Cx1 of Comparative Example 1 has a configuration for sampling the offset voltage previous to the differential amplification performed by the preamplifier circuit. In such configuration, as illustrated in FIG. 8B, the offset voltage sampling (period ta) and the differential amplification are repeated in the preamplifier circuit and the analog-digital conversion and the sampling therefor are repeated in the ADC, by switching between a switch SW4 group and a switch SW5 group. Furthermore, as illustrated in FIGS. 9A and 9B, the analog-digital conversion system Cx2 of Comparative Example 2 has a configuration where the sampling circuit portion of the offset voltage for auto-zeroing is removed from the analog-digital conversion system Cx1 of Comparative Example 1.

(Offset Voltage Reduction Effect)

Figure 10:
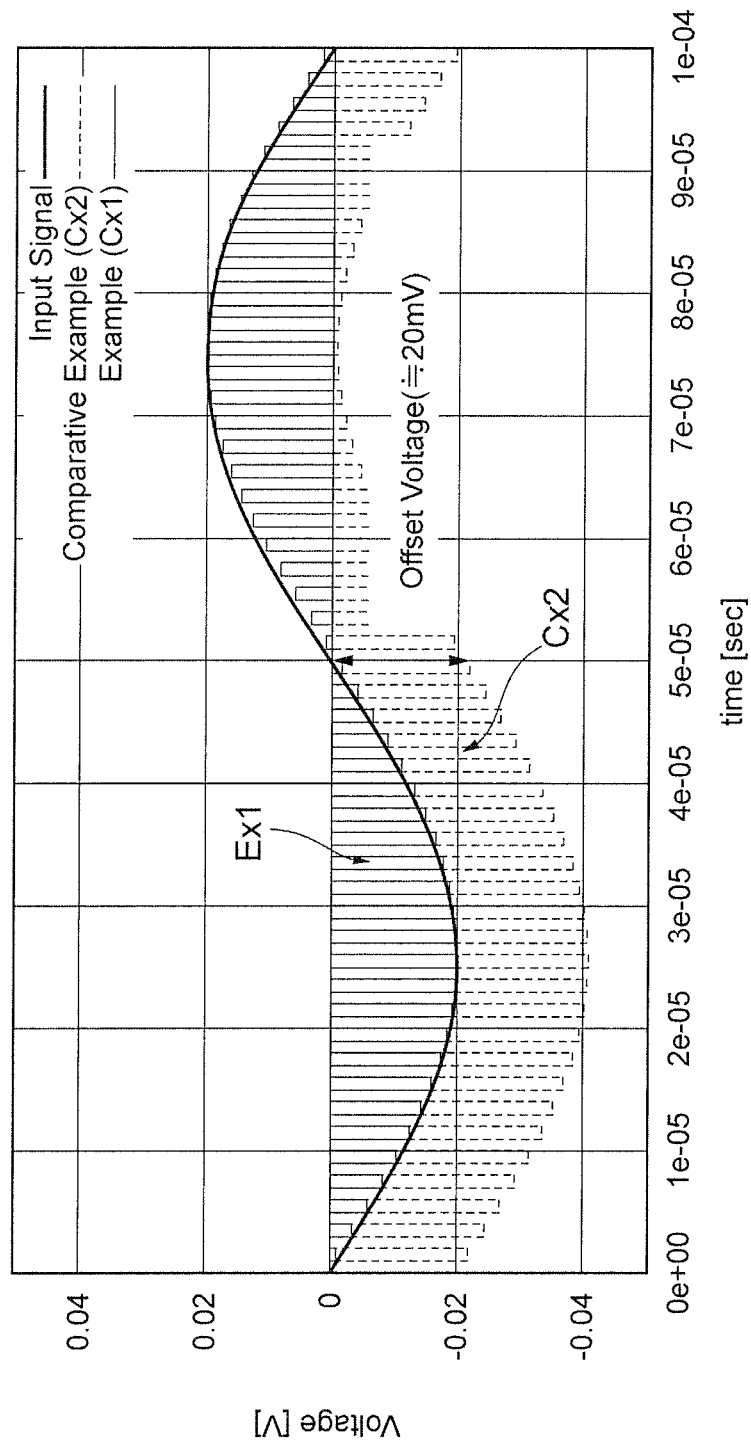
FIG. 10 is a graph illustrating a result of a simulation of an influence of an offset voltage on an input signal with respect an analog-digital conversion system according to various embodiments.

FIG. 10 is a graph illustrating a result of a simulation of the influence of the offset voltage on an input signal with respect to the analog-digital conversion system Ex1 of Example 1 and the analog-digital conversion system Cx2 of Comparative Example 2. From this result, it was confirmed that an offset voltage of approx. 20 mV was superimposed on the input signal of a sinewave in the analog-digital conversion system Cx2 of Comparative Example 2, while it was confirmed that such superimposition of the offset voltage was not recognized and the offset voltage was satisfactorily removed in the analog-digital conversion system of Example 1.

(Noise Transfer Function)

Figure 11:
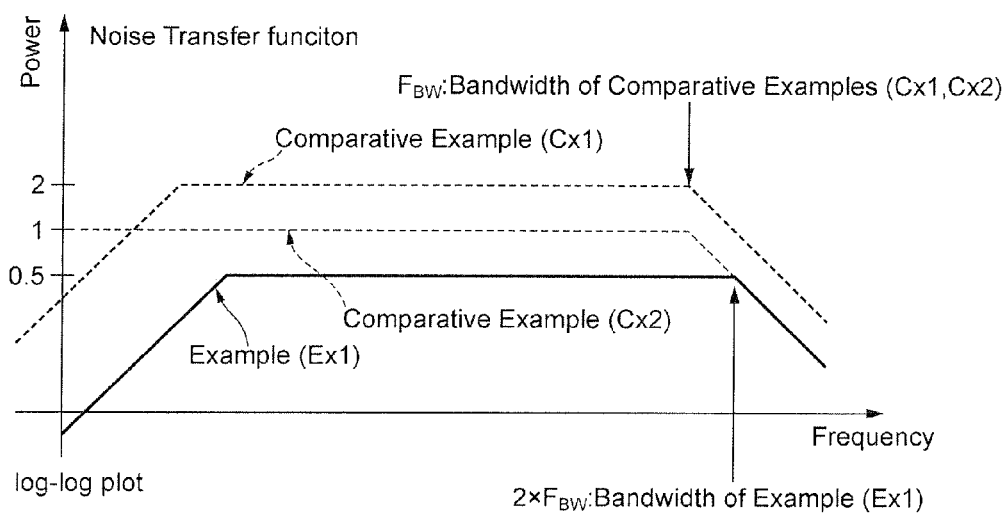
FIG. 11 is a graph schematically and collectively illustrating analysis values of a noise transfer function in analog-digital conversion systems according to various embodiments.

FIG. 11 is a graph schematically and collectively illustrating analysis values of a noise transfer function (noise output relative to a frequency: log-log plot) in the analog-digital conversion systems Ex1, Cx1, and Cx2 of Example 1 and Comparative Examples 1 and 2. From this graph, it is understood that the analog-digital conversion system Ex1 of Example 1 is superior in the noise reduction effect to the analog-digital conversion systems Cx1 and Cx2 of Comparative Examples 1 and 2 over the substantially entire band of noise frequencies.

For example, in the intermediate frequency band, the noise outputs (power) of the analog-digital conversion systems Cx1 and Cx2 of Comparative Examples 1 and 2 are 2 and 1, respectively, while the noise output (power) of the analog-digital conversion system Ext of Example 1 is 0.5, which means that the noise output of Example 1 is reduced to half or less than the comparative examples. This is achieved by an effect of averaging processing using the method of sampling by the divided capacitor. Furthermore, it is understood that the lower in frequency the noise (low frequency noise) is, the higher the reduction effect is. On the other hand, it is understood that noise increases in the high frequency region not including the low frequency region in the analog-digital conversion system Cx1 of Comparative Example 1 using the conventional AZ technique.

In any of the analog-digital conversion systems Ext, Cx1, and Cx2, the noise transfer characteristic is reduced on the high frequency side due to an influence of a cutoff frequency of the preamplifier circuit. Regarding the cutoff frequency, the cutoff frequency doubles since the capacitive charge is charged in half time (ta/2) of the sampling period (ta) of the analog-digital conversion systems Cx1 and Cx2 of Comparative Examples 1 and 2, in the analog-digital conversion system Ex1 of Example 1.

(Output Noise Frequency Characteristic)

Figure 12:
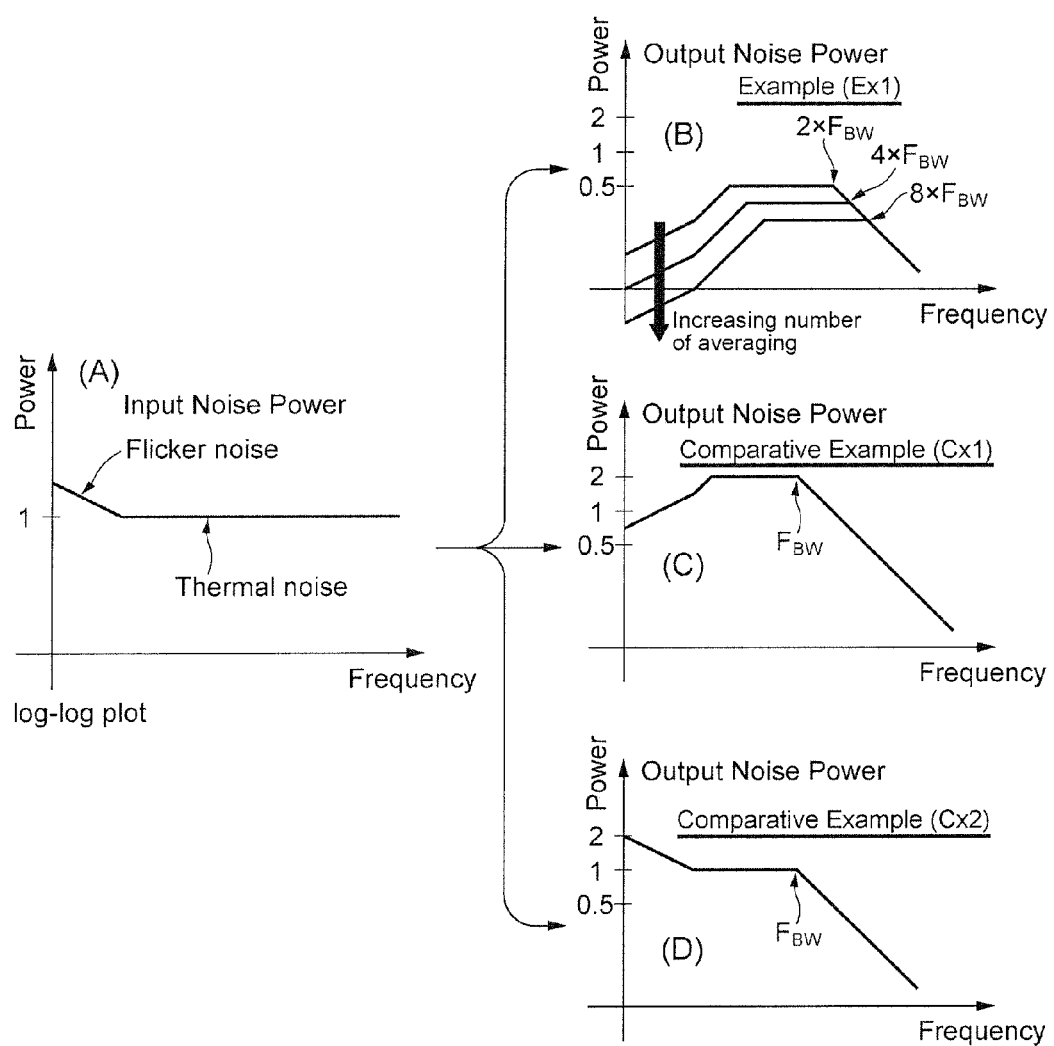
FIG. 12 is a graph schematically illustrating analysis values of the frequency characteristic of an output for noise occurring in a preamplifier circuit, with respect to the analog-digital conversion systems according to various embodiments.

The following discusses the frequency characteristic of the output noise of the preamplifier circuit with respect to the above noise transfer function. FIG. 12 is a graph obtained by analytically determining the frequency characteristic of the output at an occurrence of the same noise in the preamplifier circuit, with respect to the analog-digital conversion systems Ex1, Cx1, and Cx2 of Example 1 and Comparative Examples 1 and 2. In FIG. 12, a graph (A) illustrates a noise which occurs in the preamplifier circuit and graphs (B) to (D) illustrate output signals of the preamplifier circuit in the analog-digital conversion systems Ex1, Cx1, and Cx2 of Example 1 and Comparative Examples 1 and 2, respectively. The noise state illustrated in the graph (A) is modeled on the state where a flicker noise is superimposed as a low frequency component on a thermal noise (noise power=1) over the entire frequency band.

To summarize, first, the output voltage signal of the preamplifier circuit is sampled by the ADC in the subsequent stage thereof in any of the analog-digital conversion systems Ex1, Cx1, and Cx2. Therefore, noises at the frequencies equal to or higher than the frequency ($F_S/2$) which is half of the sampling frequency ($F_S$) of the ADC are folded back into the band ($F_S/2$) (the Nyquist theorem). Then, the output noise integrated in the entire frequency band appears as a noise in the preamplifier circuit.

Thus, as illustrated in the graph (B) of FIG. 12, the maximum noise power in the band of the cutoff frequency ($F_{BW}$) or lower frequencies is 0.5 (as described above, the cutoff frequency is doubled, or $2 \times F_{BW}$) in the analog-digital conversion system Ex1 of Example 1. On the other hand, as illustrated in the graph (C) of FIG. 12, the maximum noise power in the band of the cutoff frequency or lower frequencies is 2 in the analog-digital conversion system Cx1 of Comparative Example 1. Furthermore, as illustrated in the graph (D) of FIG. 12, the noise power tends to increase as the frequency decreases in an extremely low frequency region where flicker noise is more dominant than thermal noise in the analog-digital conversion system Cx2 of Comparative Examples 2. In the region where thermal noise is dominant, the maximum noise power in the band of the cutoff frequency ($F_{BW}$) or lower frequencies is 1. The relationship between the cutoff frequency ($F_{BW}$) and the sampling frequency ($F_S$) is normally $F_{BW} \gg F_S$.

Figure 13:
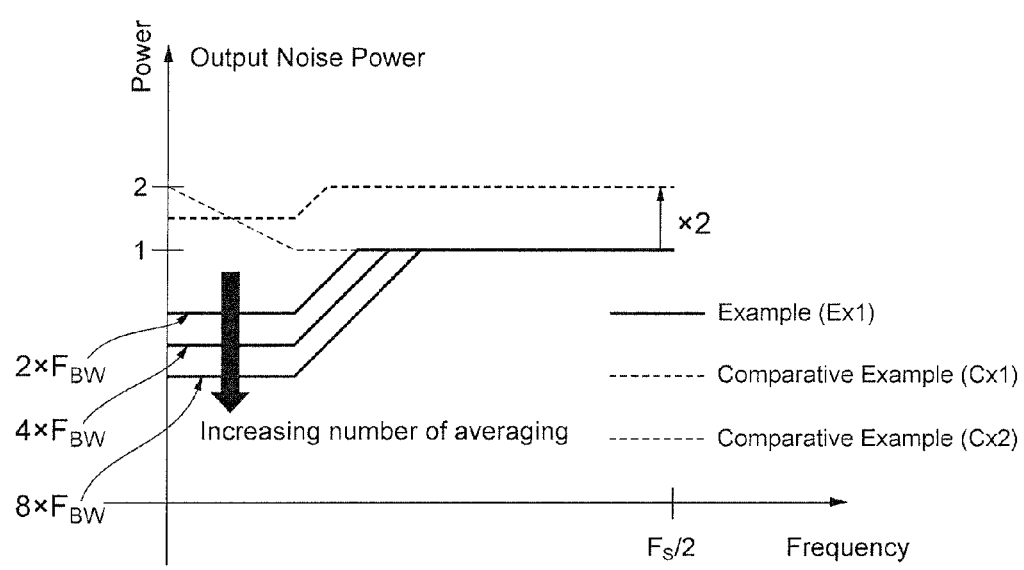
FIG. 13 is a graph illustrating a simulation result of the frequency characteristic of an output for noise with respect to the analog-digital conversion systems according to various embodiments.
Figure 14A:
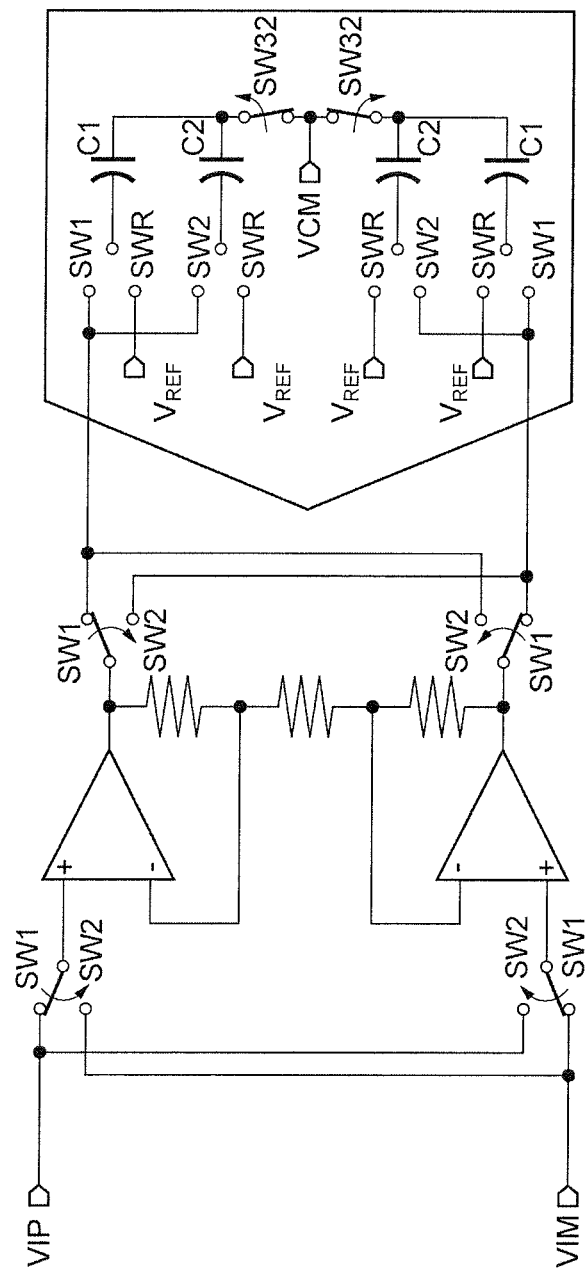
FIGS. 14A-C are block diagrams analog-digital conversion systems according various embodiments.
Figure 14B:
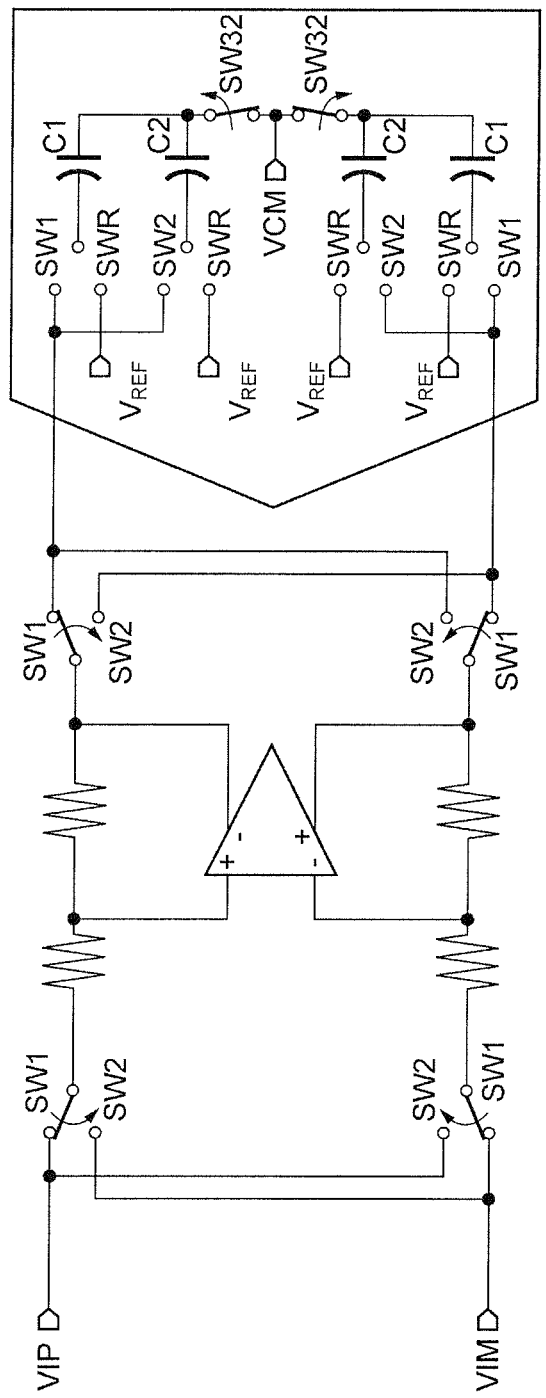
Figure 14C:
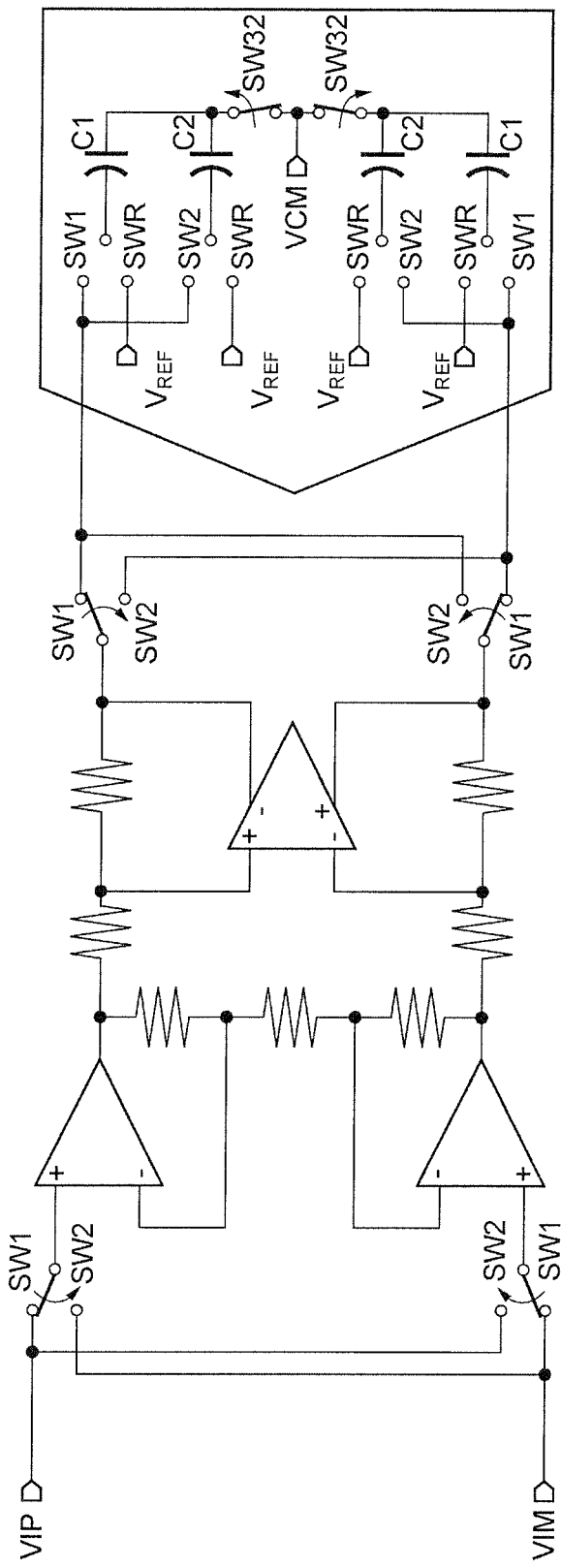
Figure 15A:
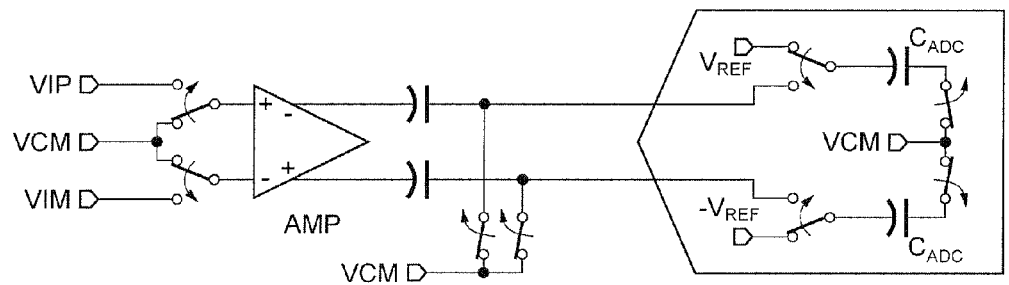
FIGS. 15A-C are block diagrams illustrating basic circuit configuration examples of a conventional auto-zeroing technique according to various embodiments.
Figure 15B:
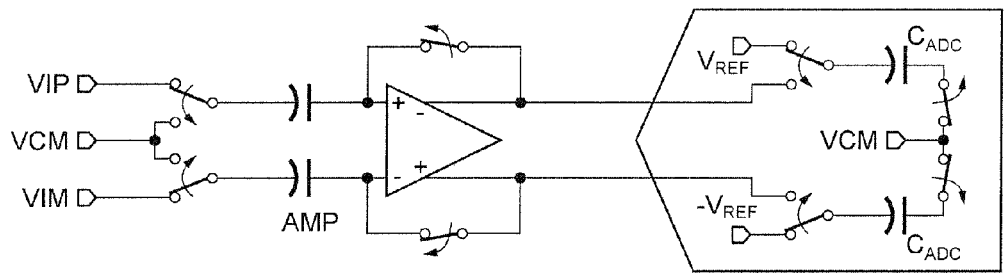
Figure 15C:
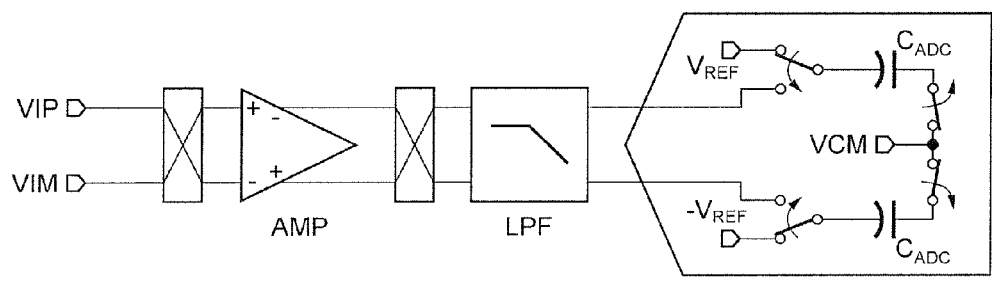

Furthermore, FIG. 13 is a graph illustrating a simulation result of the frequency characteristic of the output for noise illustrated in FIG. 12(A) with respect to the analog-digital conversion systems Ex1, Cx1, and Cx2 of Example 1 and Comparative Examples 1 and 2. This result also revealed that the analog-digital conversion system Ex1 of Example 1 is superior in the noise reduction effect to the analog-digital conversion systems Cx1 and Cx2 of Comparative Examples 1 and 2 over the substantially entire band of the noise frequencies to be considered and that the lower in frequency the noise is, the more remarkably the reduction effect of the noise is improved.

Moreover, "$4 \times F_{BW}$" and "$8 \times F_{BW}$" illustrated in the graph (B) of FIG. 12 and in FIG. 13 indicate the analysis values of the frequency characteristic and simulation results in the output in the case where the number of averaging is increased from 2 to 4 and 8 in the analog-digital conversion system Ex1 of Example 1. These correspond to the configuration and operation of the analog-digital conversion system 10 of the second embodiment described above (where the number of averaging n is 4 or 8). From these results, it was confirmed that an increase in the number of averaging n enables the reduction effect of the low frequency noise to be further improved.

(Theoretical Study on Noise Amount)

Furthermore, a theoretical derivation is attempted here, with respect to a noise amount (a noise amount output for the input noise where the aforementioned thermal noise is dominant) in each of the analog-digital conversion systems Ex1, Cx1, and Cx2 of Example 1 and Comparative Examples 1 and 2.

First, the noise frequency characteristic in the analog-digital conversion system Cx2 (w/o AZ method) of Comparative Example 2 is represented by the following formula (11):

$$V_{n,o}|_{w/o\,AZ} = V_n \cdot \sin(2\pi \cdot f \cdot t) \quad (11)$$

Taking an effective value in the formula (11), the following formula (12) is achieved:

$$V_{n,o,R|w/oAZ} = \frac{V_n}{\sqrt{2}} \quad (12)$$

On the one hand, the noise frequency characteristic in the analog-digital conversion system Cx1 (AZ method) of Comparative Example 1 is represented by the following formula (13):

$$V_{n,o}|_{w/i\,conv.AZ} = V_n \cdot \{\sin(2\pi \cdot f \cdot t) - \sin[2\pi \cdot f \cdot (t+t_a)]\} \quad (13)$$

Taking an effective value in the formula (13), the following formula (14) is achieved:

$$V_{n,o,R|w/iconv\cdot AZ} = \sqrt{2} \cdot V_n \cdot \sqrt{\sin\left(2 \cdot \pi \cdot f \cdot \frac{t_a}{2}\right)^2} \quad (14)$$

On the other hand, the noise frequency characteristic in the analog-digital conversion system Ex1 of Example 1 is represented by the following formula (15):

$$V_{n,o|w/iprop\cdot AZ} = \frac{V_n}{2} \cdot \left\{\sin(2\pi \cdot f \cdot t) - \sin\left[2\pi \cdot f \cdot \left(t + \frac{t_a}{2}\right)\right]\right\} \quad (15)$$

Taking an effective value in the formula (15), the following formula (16) is achieved:

$$V_{n,o,R|w/iprop\cdot AZ} = \frac{V_n}{\sqrt{2}} \cdot \sqrt{\sin\left(2 \cdot \pi \cdot f \cdot \frac{t_a}{4}\right)^2} \quad (16)$$

Furthermore, assuming that a high frequency component whose frequency is equal to or higher than the cutoff frequency of the preamplifier circuit is decreased at $-20$ dB/decade and at the same time not completely transferred in the analog-digital conversion systems Ex1, Cx1, and Cx2, the estimate of the integral value of output noise power in each analog-digital conversion system is derived as described below.

Supposing that $F_{BW}$ is the cutoff frequency in the preamplifier circuits of the analog-digital conversion systems Cx1 and Cx2 of Comparative Examples 1 and 2, "$2 \times F_{BW}$" is the cutoff frequency in the analog-digital conversion system Ex1 of Example 1 as described above since averaging is performed with twice sampling. Then, the integral value of output noise power is obtained by integrating the square of the noise effective value up to the cutoff frequency.

Then, first, the analog-digital conversion system Cx2 (w/o AZ method) of Comparative Example 2 integrates the formula (12) to obtain the value of the following formula (17):

$$V_{n,o,rms|w/oAZ}^2 = \int_0^{F_{BW}} (V_{n,o,R|w/oAZ})^2 df = \frac{V_n^2}{2} \cdot F_{BW} \quad (17)$$

Moreover, the analog-digital conversion system Cx1 (AZ method) of Comparative Example 1 integrates the formula (14) to obtain the relational expression of the following formula (18):

$$V_{n,o,rms|w/iconv\cdot AZ}^2 = \quad (18)$$
$$\int_0^{F_{BW}} (V_{n,o,R|w/iconv\cdot AZ})^2 df = V_n^2 \cdot \left[F_{BW} - \frac{\sin(2\pi \cdot F_{BW} \cdot t_a)}{2\pi \cdot t_a}\right]$$

In the above formula (18), the value of the following formula (20) is obtained according to a condition represented by the following formula (19):

$$\text{if } 2\pi \cdot F_{BW} \cdot t_a \gg 1 \quad (19)$$

$$V_{n,o,rms|w/i\,conv.AZ}^2 = V_n^2 \cdot F_{BW} \quad (20)$$

Furthermore, the analog-digital conversion system Ext of Example 1 integrates the formula (16) to obtain the relational expression of the following formula (21):

$$V_{n,o,rms|w/iprop\cdot AZ}^2 = \quad (21)$$
$$\int_0^{2F_{BW}} (V_{n,o,R|w/iprop\cdot AZ})^2 df = \frac{V_n^2}{2} \cdot \left[F_{BW} - \frac{\sin(2\pi \cdot F_{BW} \cdot t_a)}{2\pi \cdot t_a}\right]$$

In the above formula (21), the value of the following formula (23) is obtained according to a condition represented by the following formula (22) (which is the same as the formula (19)):

$$\text{if } 2\pi \cdot F_{BW} \cdot t_a \gg 1 \quad (22)$$

$$V_{n,o,rms|w/iprop \cdot AZ2}{}^2 = \frac{V_n^2}{2} \cdot F_{BW} \quad (23)$$

Moreover, as described above, in any of the analog-digital conversion systems Ex1, Cx1, and Cx2, the ADC sampling operation causes the noises having frequencies equal to or higher than the frequency ($F_S/2$) which is half of the sampling frequency ($F_S$) of the ADC to be folded back into the band ($F_S/2$). Therefore, all of noises up to the cutoff frequency in the preamplifier circuit determined here are output noises. Accordingly, it is understood again that noises increase in the analog-digital conversion system Cx1 in the AZ method of Comparative Example 1 in comparison with the analog-digital conversion system Cx2 in the w/o AZ method of Comparative Example 2 and that the noise reduction effect is enhanced in the analog-digital conversion system Ex1 of Example 1, from the comparison among the formulae (17), (20), and (23).

(Theoretical Study on Relationship Between Number of Averaging and High Frequency Noise)

Moreover, the following discusses the presence/absence of a change in the high frequency noise in the case where the aforementioned number of averaging n is changed in the analog-digital conversion system. First, the analog-digital conversion system Ex1 of Example 1 performs averaging twice (n=2) as an averaging operation and therefore the integration of the noise effective value in this case is the same as in the above formula (23).

Subsequently considering the case of n=4, the noise frequency characteristic in this case is represented by the following formula (24):

$$V_{n,o|w/iprop \cdot AZ4} = \frac{V_n}{2} \cdot \left\{ \sin(2\pi \cdot f \cdot t) - \sin\left[2\pi \cdot f \cdot \left(t + \frac{t_a}{4}\right)\right] + \sin\left[2\pi \cdot f \cdot \left(t + \frac{2t_a}{4}\right)\right] - \sin\left[2\pi \cdot f \cdot \left(t + \frac{3t_a}{4}\right)\right] \right\} \quad (24)$$

Taking an effective value in the above formula (24), the following formula (25) is obtained:

$$V_{n,o,R|w/iprop \cdot AZ4} = \frac{V_n}{2} \cdot \sqrt{\sin\left(2 \cdot \pi \cdot f \cdot \frac{t_a}{4}\right)^2} \cdot \sqrt{1 + \cos\left(2\pi \cdot f \cdot \frac{t_a}{2}\right)} \quad (25)$$

Then, the square of the noise effective value in the formula (25) is integrated up to the cutoff frequency to obtain the relational expression of the following formula (26):

$$V_{n,o,rms|w/iprop \cdot AZ4}{}^2 = \quad (26)$$

$$\int_0^{4F_{BW}} (V_{n,o,R|w/iprop \cdot AZ4})^2 df = \frac{V_n^2}{2} \cdot \left[ F_{BW} - \frac{\sin(2\pi \cdot F_{BW} \cdot t_a)}{2\pi \cdot t_a} \right]$$

In this formula (26), the value of the following formula (28) is obtained according to a condition represented by the following formula (27) (which is the same as the formula (19)):

$$\text{if } 2\pi \cdot F_{BW} \cdot t_a \gg 1 \quad (27)$$

$$V_{n,o,rms|w/iprop \cdot AZ2}{}^2 = \frac{V_n^2}{2} \cdot F_{BW} \quad (28)$$

From the comparison between the formula (23) and the formula (28), it is understood that even an increase in the number of averaging does not cause an increase in the high frequency noise.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance. Additionally, it should be understood that none of the examples or explanations contained herein are meant to convey that the described embodiments have been actually reduced to practice.

The breadth and scope of the present disclosure should not be limited by any of the above-described exemplary embodiments, but should be defined only in accordance with the following claims and their equivalents.

What is claimed is:

1. A system, comprising:
 a preamplifier circuit configured to differentially amplify an input analog signal and output first and second analog differential signals;
 an analog-to-digital converter coupled to the output of the preamplifier circuit; and
 an averaging circuit configured to average the first and second analog differential signals,
 wherein the preamplifier is configured to mix an offset voltage, and
 wherein the preamplifier circuit is configured to output the first and second analog differential signals such that the phase of the first and second analog differential signals is inverted with respect to the offset voltage.

2. A system, comprising:
 a preamplifier circuit configured to differentially amplify an input analog signal and output first and second analog differential signals;
 an analog-to-digital converter coupled to the output of the preamplifier circuit; and
 an averaging circuit configured to average the first and second analog differential signals,
 wherein the analog to digital converter is configured to output a digital signal based on the differential signal averaged by the averaging circuit.

3. The system of claim 2, wherein the averaging circuit further comprises capacitors corresponding to the first and second analog differential signals.

4. The system of claim 3, wherein the averaging circuit is configured to average the first and second analog differential signals using the capacitors by sampling the capacitors at least once for each clock cycle of a clock.

5. The system of claim 2, further comprising:
an inverting input terminal;
a non-inverting input terminal; and
an input switching section configured to switch one or more input voltage signals between the inverting input terminal and the non-inverting input terminal.

6. The system of claim 5, wherein the preamplifier circuit comprises an output switching section configured to switch between the first and second analog differential signals.

7. The system of claim 6, wherein the averaging circuit includes a distribution section configured to selectively distribute the first and second analog differential signals to first and second capacitors corresponding to the first and second analog signals, respectively.

8. The system of claim 7, wherein the input switching section, the output switching section, and the distribution section are mutually linked.

9. A method, comprising:
generating first and second analog differential signals by differentially amplifying an input analog signal using a preamplifier circuit;
averaging the first and second analog differential signals; and
outputting a digital signal based on the averaged differential signal; and
mixing an offset voltage using the preamplifier circuit, wherein generating the first and second analog differential signals further comprises generating the first and second analog differential signals such that the phase of the first and second analog differential signals is inverted with respect to the offset voltage.

10. The method of claim 9, further comprising switching the input voltage signal between an inverting input terminal and a non-inverting input terminal.

11. The method of claim 10, further comprising switching the output of the preamplifier circuit between the first and second analog differential signals.

12. The method of claim 11, further comprising:
Distributing the first and second analog differential signals to first and second capacitors corresponding to the first and second analog differential signals, respectively.

13. The method of claim 12, wherein switching the input voltage signal, switching the output of the preamplifier, and distributing the first and second analog differential signals are performed using mutually linked switches.

14. The method of claim 9, further comprising sampling the first and second analog differential signals using first and second capacitors corresponding to the first and second analog differential signal, respectively.

15. The method of claim 14, further wherein the first and second analog differential signals are sampled using the first and second capacitors a plurality of times for each clock cycled of a clock.

16. The method of claim 9, wherein averaging the first and second analog differential signals comprises linearly combining the electrical charges of the first and second analog differential signals.

* * * * *